United States Patent
Hikita et al.

(10) Patent No.: US 6,396,154 B1
(45) Date of Patent: May 28, 2002

(54) SEMICONDUCTOR DEVICE

(75) Inventors: Junichi Hikita; Hiroo Mochida, both of Kyoto (JP)

(73) Assignee: Rohm Co., LTD, Kyoto (JP)

( * ) Notice: Subject to any disclaimer, the term of this patent is extended or adjusted under 35 U.S.C. 154(b) by 0 days.

(21) Appl. No.: 09/493,168

(22) Filed: Jan. 28, 2000

(30) Foreign Application Priority Data

Jan. 29, 1999 (JP) .......................... 11-022689

(51) Int. Cl.[7] .................. H01L 23/48; H01L 23/52; H01L 29/40
(52) U.S. Cl. .................. 257/778; 257/686; 257/690
(58) Field of Search .................. 257/778, 673, 257/686, 687, 690, 723, 728, 777

(56) References Cited

U.S. PATENT DOCUMENTS

| | | | |
|---|---|---|---|
| 4,290,118 A | * 9/1981 | Stern et al. .................. 365/183 |
| 5,422,615 A | * 6/1995 | Shibagaki et al. .......... 333/246 |
| 5,438,305 A | * 8/1995 | Hikita et al. .................. 333/32 |
| 6,057,598 A | * 5/2000 | Payne et al. ................. 257/723 |
| 6,133,637 A | * 10/2000 | Hikita et al. ................. 257/777 |
| 6,166,436 A | * 12/2000 | Maeda et al. ................ 257/723 |

* cited by examiner

Primary Examiner—Lincoln Donovan
Assistant Examiner—Kyung S. Lee
(74) Attorney, Agent, or Firm—Rader, Fishman & Grauer, PLLC

(57) ABSTRACT

A semiconductor device having a chip-on-chip structure in which a semiconductor chip having a connecting pad formed on its surface and a surface movable element overlapped with and joined to the surface of the semiconductor chip are overlapped with each other. The surface movable element has a movable element and a connecting pad on its surface opposite to the semiconductor chip. The connecting pad on the surface of the semiconductor device and the connecting pad on the surface of the surface movable element are connected to each other through a pad joint. The pad joint ensures an operating space for allowing an operation of moving the movable element between the semiconductor chip and the surface movable element. The movable element may be a surface acoustic wave element.

10 Claims, 2 Drawing Sheets

US 6,396,154 B1

SEMICONDUCTOR DEVICE

BACKGROUND OF THE INVENTION

1. Field of the Invention

The present invention relates to a semiconductor device constructed by combining a movable element such as a surface acoustic wave filter and other semiconductor elements.

2. Description of Related Art

For example, in a mobile telephone set represented by an automobile telephone set or a portable telephone set, a surface acoustic wave (SAW: Surface Acoustic Waves) filter has been employed for signal processing in a high frequency band. The surface acoustic wave filter converts an electric signal into surface acoustic waves propagating through a surface layer of an elastic member, and takes out the surface acoustic waves which have propagated through the surface of the elastic member as an electric signal. The surface acoustic wave filter is constructed by forming comb-shaped electrodes on the surface of a solid such as silicon. Frequency characteristics can be determined by the shape, for example, of the electrodes, thereby making it possible to construct a filter having desired frequency characteristics.

A digital signal processing circuit or the like in the mobile telephone set is constituted by a silicon LSI chip, and is sealed with resin. If the surface of a surface vibrating element such as a surface acoustic wave filter is covered with sealing resin, however, the vibration of the surface vibrating element is restrained, degrading the characteristics thereof. Consequently, it is impossible to seal the movable element with resin.

Therefore, an internal circuit in the mobile telephone set is constructed by mounting a surface acoustic wave filter element on a wiring substrate in addition to an LSI package such as the digital signal processing circuit. Therefore, the miniaturization of the wiring substrate has a limitation, which prevents the mobile telephone set from being miniaturized.

SUMMARY OF THE INVENTION

An object of the present invention is to provide a semiconductor device capable of containing a movable element, together with a semiconductor chip having other functional elements formed thereon, in the same package.

In order to attain the above-mentioned object, the present invention is directed to a semiconductor device, characterized by comprising a semiconductor chip having a connecting pad formed on its surface, a surface movable element overlapped with and joined to the surface of the semiconductor chip and having a movable element and a connecting pad formed on its surface opposite to the semiconductor chip, and a pad joint for connecting the connecting pad on the surface of the semiconductor chip and the connecting pad on the surface of the surface movable element to each other and ensuring an operating space for allowing an operation of moving the movable element between the semiconductor chip and the surface movable element.

According to this construction, the connecting pads are connected to each other by the pad joint in a state where the surface, where the movable element is formed, of the surface movable element is opposite to the surface of the semiconductor chip, and the semiconductor chip and the surface movable element are overlapped with and joined to each other, so that a semiconductor device having a so-called chip-on-chip structure is constructed. The operating space for the movable element is ensured between the opposite surfaces of the semiconductor chip and the surface movable element by the function of the pad joint. Consequently, the semiconductor chip and the surface movable element can be sealed with resin, for example, and contained in the same package without degrading the characteristics of the movable element. Consequently, the movable element, together with the semiconductor chip having other functional elements formed thereon, can be contained in the same package, thereby making it possible to miniaturize an electronic equipment using the movable element.

It is preferable that the pad joint is a metal raised portion provided on the connecting pad of the semiconductor chip or the surface movable element. The metal raised portion in this case may be a so-called bump obtained by raising a metal by plating, or may be a metal evaporated film which is not raised so high as the bump.

According to this construction, the semiconductor chip and the surface movable element are overlapped with and joined to each other by the metal raised portion provided on the surface of the semiconductor chip or the surface movable element, thereby making it possible to ensure the operating space between the surfaces of the semiconductor chip and the surface movable element.

The movable element may be a surface acoustic wave element, which includes a surface acoustic wave filter element.

According to this construction, the operating space is ensured between the opposite surfaces of the semiconductor chip and the surface movable element. Accordingly, the characteristics of the surface acoustic wave element using the surface acoustic waves propagating through a surface layer of the surface movable element are satisfactorily held.

It is preferable that the semiconductor device further comprises a peripheral edge joint arranged between the semiconductor chip and the surface movable element for joining the semiconductor chip and the surface movable element to each other and surrounding a peripheral edge of the surface movable element.

According to this construction, the semiconductor chip and the surface movable element -are joined to each other by the peripheral edge joint surrounding the movable element, so that the operating space for the movable element can be blocked from an external space. When the semiconductor chip and the surface movable element are sealed with resin, for example, and contained in the same package, therefore, the characteristics of the movable element can be reliably prevented from being changed by the sealing with resin, for example.

It is preferable that the peripheral edge joint is provided at the peripheral edge of the surface movable element, that is, outside an area where the movable element is formed.

The peripheral edge joint may be composed of the same material as that of the pad joint. In this case, the pad joint and the peripheral edge joint can be formed at the same step.

Furthermore, the peripheral edge joint may be constituted by a metal raised portion provided on the surface of either one of the semiconductor chip and the surface movable element. When the pad joint and the peripheral edge joint are composed of the same material, it is preferable that the peripheral edge joint is also provided on either of the semiconductor chip or the surface movable element 1 on which the pad joint is provided.

The pad joint and/or the peripheral edge joint may be constituted by metal raised portions provided on both the semiconductor chip and the surface movable element. In this case, the metal raised portions respectively provided on the semiconductor chip and the surface movable element are joined to each other.

It is preferable that the peripheral edge joint is composed of a conductive material.

In this case, if the conductive peripheral edge joint is connected to a low impedance portion (for example, a power supply portion or a ground portion) of the semiconductor chip or the surface movable element, the peripheral edge portion can function as an electromagnetic shield. Consequently, it is possible to reduce the effect of external noises on elements arranged in a space inside the peripheral edge joint.

It is preferable that a shielding film composed of a metal is formed on a reverse surface that is a surface opposite to the surface, where the movable element is formed, of the surface movable element.

According to this construction, the movable element can be shielded magnetically and electrically by the shielding film. If the shielding film is connected to the low impedance portion such as the power supply portion or the ground portion, the shielding film can function as an electromagnetic shield, thereby making it possible to further stabilize the characteristics of the movable element.

In a case where the peripheral edge joint is composed of a conductive material, if the peripheral edge joint and the shielding film are electrically connected to each other, the shielding effect can be further increased.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
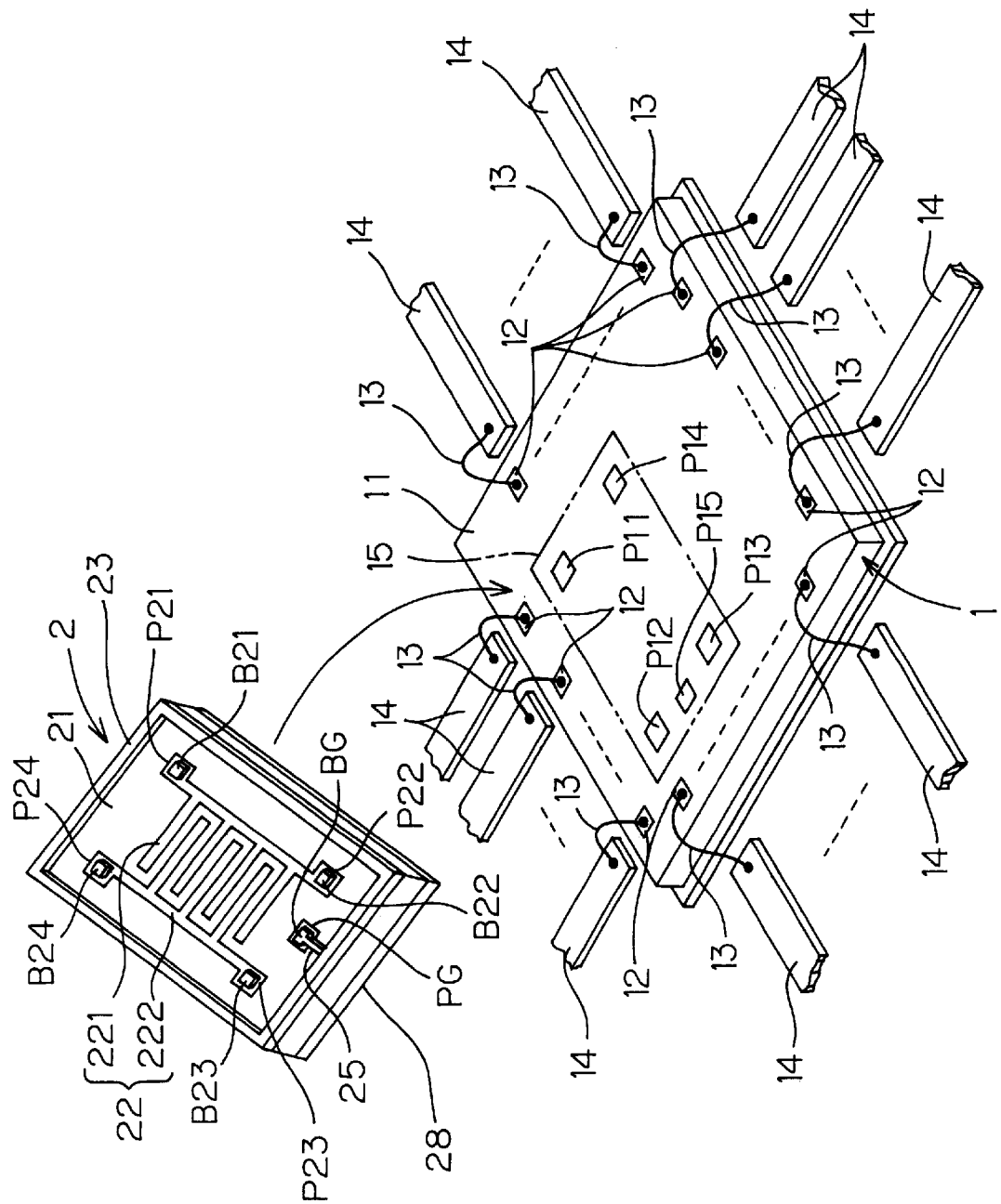
FIG. 1 is an exploded perspective view of a semiconductor device according to an embodiment of the present invention.
Figure 2:
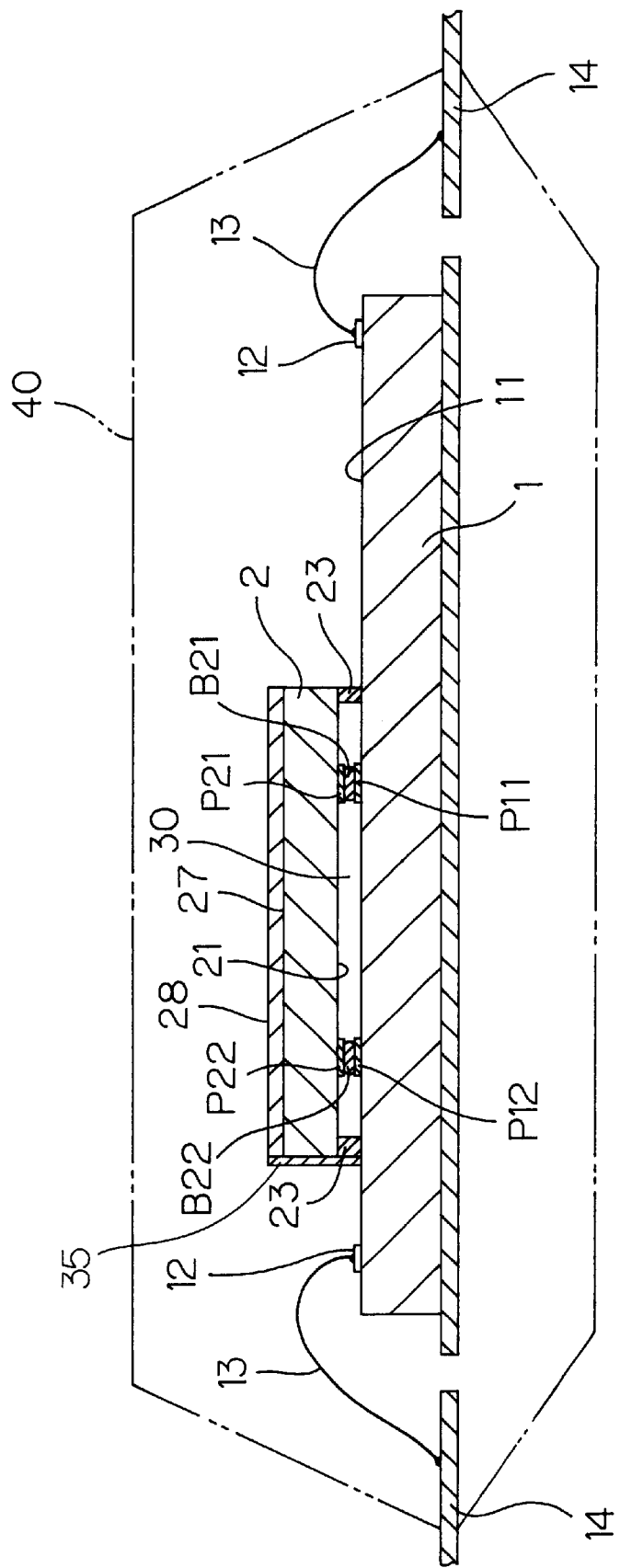
FIG. 2 is a cross-sectional view of the semiconductor device.

FIG. 1 is an exploded perspective view of a semiconductor device according to an embodiment of the present invention, and FIG. 2 is a cross-sectional view of the semiconductor device. The semiconductor device has a so-called chip-on-chip structure in which a daughter chip or secondary chip 2 serving as a surface movable element is overlapped with and joined to a surface 11 of a mother chip or primary chip 1 serving as a semiconductor chip.

The mother chip 1 is constituted by a silicon chip, for example. The surface 11 is a surface on the side of an active surface layer area, where functional elements such as transistors are formed, on a semiconductor substrate. The uppermost surface is covered with a protective film composed of an insulating material. A plurality of pads 12 for external connection are arranged with the pads exposed in the vicinity of a peripheral edge of the surface 11 of the mother chip 1, which has an approximately rectangular plane shape, in predetermined positions on the protective film. The external connection pads 12 are to be connected to a lead frame 14 by a bonding wire 13.

A joining area 15 for the daughter chip 2 is set in an area inside the mother chip 1. A plurality of (five in the present embodiment) internal connection pads P11, P12, P13, P14, and P15 (connecting pads) for connection to the daughter chip 2 are arranged in the joining area 15.

The daughter chip 2 is composed of ceramic, for example, and has a surface acoustic wave filter 22 formed on its surface 21, to construct a surface acoustic wave filter element. The surface acoustic wave filter 22 is constructed by forming a pair of comb-shaped electrodes (cross finger electrodes) 221 and 222 which are engaged with each other on a solid surface of the daughter chip 2. Connection pads P21, P22, P23, and P24 (connecting pads) are respectively connected to both ends of the comb-shaped electrode 221 and both ends of the comb-shaped electrode 222. A pad PG (a connecting pad) is formed in a position close to a peripheral edge on the surface of the daughter chip 2. Bumps B21, B22, B23, B24, and BG composed of an oxidation resistant metal, for example, gold, lead, platinum, silver or iridium are respectively formed on the pads P21, P22, P23, P24, and PG, thereby constructing metal raised portions constituting pad joints.

The daughter chip 2 is joined to the mother chip 1 in a state where the surface 21 is opposite to the surface 11 of the mother chip 1. This joining is achieved by pressing the mother chip 1 and the daughter chip 2 against each other in a state where the bumps B21 to B24 and PG are respectively abutted against the internal connection pads P11 to P15 in the joining area 15. In the case of the pressing, reliable joining between the bumps B21 to B24 and BG and the internal connection pads P11 to P14 and PG is achieved by transmitting ultrasonic vibration to the mother chip 1 and/or the daughter chip 2, as required.

As shown in FIG. 2, in a state where the mother chip 1 and the daughter chip 2 are joined to each other, an operating space 30 for allowing an operation of vibrating the surface acoustic wave filter 22 is ensured between the surface 11 of the mother chip 1 and the surface 21 of the daughter chip 2 mainly by the functions of the bumps B21 to B24 and BG.

On the other hand, at the peripheral edge of the daughter chip 2, a wall-shaped peripheral edge joint 23 surrounding the surface acoustic wave filter 22 is formed over the whole periphery. The peripheral edge joint 23 is preferably formed of the same material as that of the bumps B21 to B24 and BG. In this case, at the steps of forming the bumps B21 to B24 and BG, the peripheral edge joint 23 can be simultaneously formed.

The peripheral edge joint 23 contributes, when the mother chip 1 and the daughter chip 2 are joined to each other, to reinforcement of the joining and seals the operating space 30 into a completely closed space. Further, the peripheral edge joint 23 is connected to the pad PG, in the daughter chip 2, connected to a ground line (corresponding to the internal connection pad P15 on the side of the mother chip 1) through wiring 25, so that the operating space 30 is electromagnetically sealed from the exterior. The wiring 25 may be simultaneously formed of the same material as that of the peripheral edge joint 23 at the time of forming the peripheral edge joint 23, and may be formed simultaneously with the comb-shaped electrodes 221 and 222.

Furthermore, a shielding film 28 composed of a magnetic metal film is formed on a reverse surface 27 of the daughter chip 2. The shielding film 28 is preferably formed of the same material as that of the bumps B21 to B24 and BG. In this case, at the steps of forming the bumps B21 to B24 and BG, the shielding film 28 can be simultaneously formed. Further, the shielding film 28 may be formed by evaporating or affixing aluminum, copper, or the like.

The shielding film 28 electromagnetically shields the daughter chip 2, to contribute to improvement of the noise characteristics of the surface acoustic wave filter 22. If the shielding film 28 is connected to a ground portion, the electromagnetic shielding effect is further improved. That is, the shielding film 28 may be connected to the peripheral edge joint 23, as indicated by reference numeral 35 in FIG. 2, or connected to a ground line on the surface of the daughter chip 2 via a through hole, or connected to a ground portion of the mother chip 1 by wire bonding. When a potential of the substrate of the daughter chip 2 is grounded, a potential on the shielding film 28 can be stabilized only by bringing the shielding film 28 into direct contact with the substrate, thereby making it possible to obtain the electromagnetic shielding effect.

As described in the foregoing, according to the semiconductor device in the present embodiment, the daughter chip 2 is chip-on-chip joined to the mother chip 1 in a state where the operating space 30 for the surface acoustic wave filter 22 is ensured. Even when the mother chip 1 and the daughter chip 2 are sealed with resin and contained in a common package 40, as indicated by a two-dot and dash line in FIG. 2, therefore, it is possible to prevent the device characteristics of the surface acoustic wave filter 22 from being degraded by restraint of the vibration thereof due to sealing resin. Moreover, the operating space 30 is a completely closed space by the function of the peripheral edge joint 23. Accordingly, there is neither possibility that the sealing resin enters the operating space 30 nor possibility that the sealing with resin affects the device characteristics of the surface acoustic wave filter 22.

Since the mother chip 1 constituting a silicon LSI or the like and the daughter chip 2 constituting a surface acoustic wave filter element can be thus sealed in the same package, an equipment such as a mobile telephone set can be miniaturized.

Since the operating space 30 can be electromagnetically sealed by the functions of the peripheral edge joint 23 and the shielding film 28 which are connected to the ground portion, the characteristics of the surface acoustic wave filter 22 can be stabilized. Consequently, the surface acoustic wave filter 22 can have superior operating characteristics on the mother chip 1.

Although description has been made of an embodiment of the present invention, the present invention can be embodied by another embodiment. Although in the above-mentioned embodiment, the surface acoustic wave filter is taken as an example as a movable element, the present invention is applicable to another apparatus which slightly moves, such as a micromachine or a sensor, in addition to a surface acoustic wave element such as an oscillator.

Although in the above-mentioned embodiment, the peripheral edge joint 23 and the shielding film 28 are connected to the ground portion, the electromagnetic shielding effect can be exhibited, provided that they are connected to a low impedance portion (a power supply portion or a ground portion).

Furthermore, in the above-mentioned embodiment, the peripheral edge joint 23 is connected to the pad PG in the daughter chip 2 through the wiring 25. Even if the peripheral edge joint 23 is connected to only the ground of the mother chip 1, however, the electromagnetic shielding effect can be obtained.

Although in the above-mentioned embodiment, the bumps B21 to B24 and BG are provided in the daughter chip 2, bumps may be provided on the mother chip 1. Chip-on-chip joining between the mother chip 1 and the daughter chip 2 may be achieved by providing the bumps in both the mother chip 1 and the daughter chip 2 and joining the bumps.

The same is true for the peripheral edge joint 23. The same peripheral edge joint may be provided on the mother chip 1. Peripheral edge joints may be provided in both the mother chip 1 and the daughter chip 2, and the peripheral edge joints may be joined to each other.

A metal raised portion for ensuring the operating space 30 between the mother chip 1 and the daughter chip 2 need not be so high. Accordingly, the metal raised portion can be generally composed of a metal evaporated film in addition to the bumps formed by eletroplating or electroless plating. The same is true for the peripheral edge joint. A thick film formed by plating can be used. Alternatively, the peripheral edge joint may be formed of a relatively thin film such as a metal evaporated film.

Although in the above-mentioned embodiment, description has been made of a case where one daughter chip 2 is joined to the surface 11 of the mother chip 1, two or more daughter chips may be joined to the surface 11 of the mother chip 1.

Furthermore, although in the above-mentioned embodiment, the mother chip 1 is a chip composed of silicon, a semiconductor chip using another arbitrary semiconductor material such as a gallium arsenic semiconductor or a germanium semiconductor can be applied to the semiconductor device according to the present invention. Materials for the mother chip and the daughter chip may be the same or different from each other.

Although the present invention has been described and illustrated in detail, it is clearly understood that the same is by way of illustration and example only and is not to be taken by way of limitation, the spirit and scope of the present invention being limited only by the terms of the appended claims.

The application claims priority benefits under 35 USC §119 of Japanese Patent Application Serial No. 11-22689 filed with the Japanese Patent Office on Jan. 29, 1999, the disclosure of which is incorporated by reference.

What is claimed is:

1. A semiconductor device, comprising:
    a semiconductor chip having a connecting pad formed in its surface;
    a chip device, having a movable element capable of performing microscopic movement on the surface thereof, overlapped with and joined to the surface of the semiconductor chip and having the movable element and a connecting pad formed on its surface opposite to the semiconductor chip;
    a pad joint for connecting the connecting pad on the surface of the semiconductor chip and the connecting pad on the surface of the surface movable element to each other and ensuring an operating space for allowing an operation of moving the movable element between the semiconductor chip and the surface movable element; and
    a peripheral edge joint arranged between the semiconductor chip and the movable element for joining the semiconductor chip and the surface movable element to each other and surrounding a peripheral edge of the movable element.

2. The semiconductor device according to claim 1, wherein the pad joint is a metal raised portion provided on the connecting pad of the semiconductor chip or the movable element.

3. The semiconductor device according to claim 1, wherein the movable element is a surface acoustic wave element.

4. The semiconductor device according to claim 1, wherein
the peripheral edge joint is composed of the same material as that of the pad joint.

5. The semiconductor device according to claim 1, wherein the peripheral edge joint is constituted by a metal raised portion provided on the surface of either one of the semiconductor chip and the movable element.

6. The semiconductor device according to claim 1, wherein
the peripheral edge joint is composed of a conductive material.

7. The semiconductor device according to claim 6, wherein the peripheral edge joint is connected to a low impedance portion of the semiconductor chip or the movable element.

8. The semiconductor device according to claim 1, wherein a shielding film composed of a metal is formed on a reverse surface of the movable element, which is a surface opposite to the surface where the movable element is formed.

9. The semiconductor device comprising:
a semiconductor chip having a connecting pad formed in its surface;
a chip device, having a movable element capable of performing microscopic movement on the surface thereof, overlapped with and joined to the surface of the semiconductor chip and having the movable element and a connecting pad formed on its surface opposite to the semiconductor chip;
a pad joint for connecting the connecting pad on the surface of the semiconductor chip and the connecting pad on the surface of the movable element to each other and ensuring an operating space for allowing an operation of moving the movable element between the semiconductor chip and the chip device;
a metal shielding film, formed on a reverse surface of the movable element, which is a surface opposite to the surface where the movable element is formed; and
a peripheral edge joint composed of a conductive material surrounding a peripheral edge of the movable element,
the shielding film and the peripheral edge joint being electrically connected to each other.

10. A semiconductor device, comprising:
a semiconductor chip having a connecting pad formed on its surface;
a chip device, having a movable element capable of performing microscopic movement on the surface thereof, overlapped with and joined to the surface of the semiconductor chip and having the movable element and a connecting pad formed on its surface opposite to the semiconductor chip;
a pad joint for connecting the connecting pad on the surface of the semiconductor chip and the connecting pad on the surface of the chip device to each other and ensuring an operating space for allowing an operation of moving the movable element between the semiconductor chip and the chip device;
a sealing resin for sealing the semiconductor chip and the chip device; and
a peripheral edge joint arranged between the semiconductor chip and the movable element for joining the semiconductor chip and the movable element to each other, the peripheral edge joint substantially surrounding the peripheral edge of the movable element to prevent the sealing resin from entering into the operating space.

* * * * *